US007072816B1

(12) United States Patent
Bullis et al.

(10) Patent No.: US 7,072,816 B1
(45) Date of Patent: Jul. 4, 2006

(54) METHOD AND SYSTEM FOR PROVIDING HIERARCHICAL SELF-CHECKING IN ASIC SIMULATION

(75) Inventors: Bryan Keith Bullis, Apex, NC (US); Raj Kumar Singh, Cary, NC (US); Foster Beaver White, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/409,940

(22) Filed: Sep. 30, 1999

(51) Int. Cl.
*G06F 17/50* (2006.01)

(52) U.S. Cl. ............................ 703/14; 703/13; 703/15; 703/22; 716/5; 716/12; 716/18

(58) Field of Classification Search ................. 703/14, 703/13, 15, 22; 716/4, 12, 5, 18; 714/739
See application file for complete search history.

(56) References Cited

U.S. PATENT DOCUMENTS

| | | | |
|---|---|---|---|
| 4,817,093 A | 3/1989 | Jacobs et al. | |
| 4,914,612 A | 4/1990 | Beece et al. | |
| 5,187,712 A | 2/1993 | Malleo-Roach et al. | |
| 5,457,697 A | 10/1995 | Malleo-Roach et al. | |
| 5,510,999 A * | 4/1996 | Lee et al. | 716/5 |
| 5,517,637 A | 5/1996 | Bruce, Jr. et al. | |
| 5,572,437 A | 11/1996 | Rostoker et al. | |
| 5,633,812 A | 5/1997 | Allen et al. | |
| 5,675,545 A | 10/1997 | Madhavan et al. | |
| 5,958,011 A * | 9/1999 | Arimilli et al. | 709/224 |
| 6,006,024 A * | 12/1999 | Guruswamy et al. | 716/12 |
| 6,083,269 A * | 7/2000 | Graef et al. | 703/14 |
| 6,157,972 A * | 12/2000 | Newman et al. | 370/912 |
| 6,161,189 A * | 12/2000 | Arimilli et al. | 713/400 |
| 6,175,946 B1 * | 1/2001 | Ly et al. | 716/4 |
| 6,182,258 B1 * | 1/2001 | Hollander | 714/739 |
| 6,292,931 B1 * | 9/2001 | Dupenloup | 716/18 |
| 6,360,191 B1 * | 3/2002 | Koza et al. | 703/6 |
| 6,378,123 B1 * | 4/2002 | Dupenloup | 716/18 |
| 6,563,159 B1 * | 5/2003 | Kunikiyo et al. | 257/297 |

FOREIGN PATENT DOCUMENTS

JP         06348781 A  * 12/1994

OTHER PUBLICATIONS

"A Model for SIMOX Buried-Oxide High-Field Conductiion", Krska et al, IEEE Transactions on Electron Devices, vol. 43, No. 11, Nov. 1996.*
"Versatile Testcase Driver For System Simulation," *IBM Technical Disclosure Bulletin*, vol. 32, No. 8A, Jan. 1990.
"Electronic Card Fault Simulator to Building Block Tester Data Path," *IBM Technical Disclosure Bulletin*, vol. 37, No. 08, Aug. 1994.

* cited by examiner

*Primary Examiner*—Fred Ferris
(74) *Attorney, Agent, or Firm*—Sawyer Law Group LLP

(57) ABSTRACT

A method and system for providing simulation of an integrated circuit during development of the integrated circuit is disclosed. The integrated circuit has an island that includes an interface. The method and system include a snooper, a checker and a generator. The snooper is coupled with an interface and is for obtaining an output provided by the island during simulation. The checker is coupled with an interface and is for checking the output to determine whether the output is a desired output. The generator is coupled with an interface and is for providing an input to the interface during simulation. The generator is coupled with a test case that directs the generator.

23 Claims, 10 Drawing Sheets

METHOD AND SYSTEM FOR PROVIDING HIERARCHICAL SELF-CHECKING IN ASIC SIMULATION

FIELD OF THE INVENTION

The present invention relates to the fabrication of complex semiconductor devices, and more particularly to a system and method for providing self-checking during simulation of an ASIC.

BACKGROUND OF THE INVENTION

When developing an integrated circuit ("IC"), particularly a complex integrated circuit such as some application specific integrated circuits ("ASICs"), several development stages are implemented. Typically, the integrated circuit is designed at a high, functional level using a behavioral language, such as Verilog or VHDL. Typically, smaller portions of the IC are designed as a functional unit, called an island. For example, the random access memory ("RAM") might be one island in a particular IC that is designed using a behavioral language. The design phase also typically includes compiling the code for each of the islands. Once the design of the islands for the IC has been completed, a simulation phase is entered. In the simulation phase, each of the islands is tested. When testing of the islands is completed, the islands are integrated together. When the entire IC has been integrated, the entire design is simulated and verified. Upon completion, the integrated simulation phase is completed. Once the simulation phase is completed, a synthesis phase is entered. In the synthesis phase, the tested, integrated design is converted to logical gates. These gates can then be converted into a specific technology, using design rules. These design rules are used to physically layout structures on the dies in the physical design stage of development.

FIG. 1 depicts one embodiment of an IC 10 that is designed using a behavioral language. The IC 10 includes islands 12, 14, 16, 18, 20 and 22. The IC 10 also includes external interfaces 24, 26 and 28 through which signals can be input to or output from the IC 10. The islands 12, 14, 16, 18, 20 and 22 are connected to each other through internal interfaces 30, 32, 34, 36, 38, and 40.

The IC 10 is hierarchical in design. The islands 12, 14, 16, 18, 20 and 22 are at a lower level in the hierarchy because the islands 12, 14, 16, 18, 20 and 22 are simpler and function as a unit. Some of the islands 12, 14, 16, 18, 20 and 22 can be stitched together, or integrated, to form a set of islands. Sets of islands form the next level in the hierarchy. Typically, a set in this level of the hierarchy is formed by pointing to the island 12, 14, 16, 18, 20 or 22 which belongs to the set. Sets of islands can be integrated to form the next level in the hierarchy of the IC 10. This level of the hierarchy typically points to sets of islands. The hierarchy continues to higher levels, forming the IC 10.

FIG. 2A depicts one embodiment of a conventional method 50 for performing the simulation phase of development for the IC 10. Thus, the conventional method 50 typically commences after individual islands 12, 14, 16, 18, 20 and 22 have been coded using a hierarchical design language and compiled in a design phase. Simulation for the IC 10 exploits the hierarchical nature of the IC 10. The conventional test cases and conventional models for testing of individual islands 12, 14, 16, 18, 20 and 22 are provided, via step 52. The individual islands 12, 14, 16, 18, 20 and 22 are then tested using the conventional test cases and models for each of the islands, via step 54. The conventional test cases and models provide a simulation environment for each of the islands 12, 14, 16, 18, 20 and 22. Thus, the conventional test cases and models provided data to each of the islands 12, 14, 16, 18, 20 and 22 and check the output of each of the islands 12, 14, 16, 18, 20 and 22. Because each island 12, 14, 16, 18, 20 and 22 is relatively simple, the testing of each island 12, 14, 16, 18, 20 and 22 can be relatively exhaustive. Step 54 continues until each of the islands 12, 14, 16, 18, 20 and 22 function.

The next level in the hierarchy is then built by integrating the level that has completed testing, via step 56. Since the level in the hierarchy that has completed testing is the islands 12, 14, 16, 18, 20 and 22, step 56 includes integrating some of the islands may be integrated into sets. Step 56, therefore, allows some of the islands to be stitched together to form a set. Thus, a new level in the hierarchy is formed. A new set of conventional test cases and models are then provided for the level of the hierarchy just formed, via step 58. Consequently, conventional test cases and conventional models are provided for each set of integrated islands in step 58. These conventional test cases and models provide a simulation environment for the newest level being tested. The newest level of the hierarchy, the integrated islands, are then tested using the new conventional test cases and models, via step 60. It is then determined whether integration is complete, via step 62. If so, then the simulation process is completed. If not, steps 56 through 62 are repeated. Thus, a new level in the hierarchy is formed by stitching the sets of islands together. New conventional test cases and models are provided and the new level in the hierarchy tested. This process of integrating portions of the current level of the hierarchy of the IC 10 to form a new level, providing test cases and models, and testing the new level is repeated until simulation of the entire IC 10 is completed.

FIG. 2B depicts the island 12 during initial testing in step 54. The conventional models 70, 72, 74 and 76 as well as the corresponding conventional test cases 71, 73, 75 and 77 have been provided. Like the islands 12, 14, 16, 18, 20 and 22, the conventional models 70, 72, 74 and 76 are compiled code. The conventional models 70, 72, 74 and 76 are preferably written in the same code as are the islands 12, 14, 16, 18, 20 and 22. The conventional models 70, 72, 74 and 76 couple to the appropriate island 12 and provide data to and receive output from the island 12. Similar conventional test cases and models (not shown) are used to individually check the other islands 14, 16, 18, 20 and 22. The conventional test cases 71, 73, 75 and 77 include data which are input to the islands by the conventional models 70, 72, 74 and 76. In addition, the conventional test cases 71, 73, 75 and 77 include sufficient intelligence to control the conventional models 72, 74, 76 and 78 during testing. For example, a conventional test case 71, 73, 75 and 77 may tell a conventional model 72, 74, 76 and 78 to input data to an island 12, wait for an output from the island 12, check the output received from the island 12 against an expected output, and flag an error if the output does not match the expected output. Thus, the conventional test cases 71, 73, 75 and 77 are relatively complex, while the conventional models 72, 74, 76 and 78 are relatively simple. The conventional test case 71, 73, 75 or 77 may also have several different permutations of the data to be input to the island 12. Therefore, although only one test case 71, 73, 75 or 77 is shown for each model 70, 72, 74 or 76, there may be numerous test cases for each model 70, 72, 74, or 76.

FIG. 2C depicts the islands 12, 14, and 16 after they have been integrated in step 56. New conventional models 80, 82, 84, 86, and 88 and new conventional test cases 81, 83, 85, 87 and 89 have been provided. Thus, the conventional models 80, 82, 84, 86, and 88 and conventional test cases 81, 83, 85, 87 and 89 are used for testing the set of islands including the islands 12, 14 and 16. The conventional models 80, 82, 84, 86, and 88 are preferably written in the same code as are the islands 12, 14, 16, 18, 20 and 22. The conventional models 80, 82, 84, 86, and 88 couple to the appropriate islands 12,14 and 16 and provide data to and receive output from the islands 12, 14 and 16. Other test cases (not shown) are used for other sets of islands. The conventional test cases 81, 83, 85, 87, and 89 include data which are input to the islands by the conventional models 80, 82, 84, 86, and 88. In addition, the conventional test cases 81, 83, 85, 87, and 89 include sufficient intelligence to control the conventional models 80, 82, 84, 86, and 88, respectively during testing. The conventional test cases 81, 83, 85, 87, and 89 may also have several different permutations of the data to be input to the island 12. Thus, the conventional test cases 81, 83, 85, 87, and 89 are relatively complex, while the conventional models 82, 84, 86, and 88 are relatively simple. The conventional test cases 81, 83, 85, 87, and 89 may also have several different permutations of the data to be input to the island 12. Therefore, although only one test case 81, 83, 85, 87, or 89 is shown for each model 80, 82, 84, 86, or 88 there may be numerous test cases for each model 80, 82, 84, 86, or 88.

FIG. 2D depicts the IC 10 just before the last round of testing is completed in step 60. Conventional models 90, 92 and 94 and conventional test cases 91, 93 and 95 are coupled to the external outputs 24, 26 and 28 of the IC 10. Thus, the conventional models 90, 92 and 94 and conventional test cases 91, 93 and 95 are used for testing the IC 10. The conventional models 90, 92 and 94 are preferably written in the same code as are the islands 12, 14, 16, 18, 20 and 22. The conventional models 90, 92, and 94 couple to the appropriate islands 16, 14 and 20 and provide data to and receive output from the islands 16, 14 and 20. The conventional test cases 91, 93 and 95 include data which are input to the islands by the conventional models 90, 92 and 94, respectively. In addition, the conventional test cases 91, 93 and 95 include sufficient intelligence to control the conventional models 90, 92 and 94, respectively, during testing. Thus, the conventional test cases 91, 93 and 95 are relatively complex, while the conventional models 90, 92 and 94 are relatively simple. The conventional test cases 91, 93 and 95 may also have several different permutations of the data to be input to the island 12. Therefore, although only one test case 91, 93 or 95 is shown for each model 90, 92, or 94 there may be numerous test cases for each model 90, 92 or 94. Thus, the conventional models 90, 92, and 94 are used in testing the highest level of the hierarchy for the IC 10. The models 90, 92 and 94 provide inputs to the IC 10, and check the outputs from the IC 10 to ensure that the IC 10 functions as desired. Once testing of this level is completed, the simulation phase of development is complete.

Although the simulation phase can be performed using the method 50 and conventional test cases and models, one of ordinary skill in the art will readily recognize that there are a number of drawbacks to using the method 50 and conventional models and test cases. Simulation typically takes place relatively close to the end of development. However, in order to complete simulation using the method 50, new conventional test cases and models are generated for each level of the hierarchy that is constructed. Thus, conventional test cases and models are provided for the individual islands as well as for sets of islands and groups of sets of islands. Thus, a large number of conventional test cases and models is needed for simulation. Furthermore, numerous conventional test cases, which are relatively difficult to construct, are required for each level in the hierarchy. Providing such a large number of conventional test cases and models islands consumes a significant amount of manpower and other resources near the date on which the IC 10 is to be completed.

Furthermore, one of ordinary skill in the art would readily realize that the conventional models are coupled to the islands at an external interface. For example, in FIG. 2C, only conventional models 84 and 86 are coupled to the island 14. During testing, the model 84 may provide an input to the island 14. The island 14 may process the input, provide an output to the island 12, receive a second input back from the island 12 and provide a second output back to the conventional model 84. The conventional model 84 only has information about the original input and the second output. The conventional model 84 can thus only check the second output. The conventional model 84 cannot check information and diagnose failures at the interface 30 between the island 12 and the island 14. Thus, conventional test cases and models are limited in their ability to test the internal workings of the IC 10 at the hierarchical level being tested.

Accordingly, what is needed is a system and method for performing a more efficient and more accurate simulation phase in IC development. The present invention addresses such a need.

SUMMARY OF THE INVENTION

The present invention provides a method and system for providing simulation of an integrated circuit during development of the integrated circuit. The integrated circuit has an island that includes an interface. The method and system include a snooper, a checker and a generator. The snooper is coupled with the interface and is for obtaining an output provided by the island during simulation. The checker is coupled with the interface and is for checking the output to determine whether the output is a desired output. The generator is coupled with the island and is for providing an input to the island during simulation. The generator is coupled with a test case that directs the generator.

According to the system and method disclosed herein, the present invention provides a system and method for performing simulation for an ASIC that allows for reuse of the snooper, checker or generator; that can check outputs on interfaces and that allows simplified test cases to be used.

DETAILED DESCRIPTION OF THE INVENTION

Figure 1:
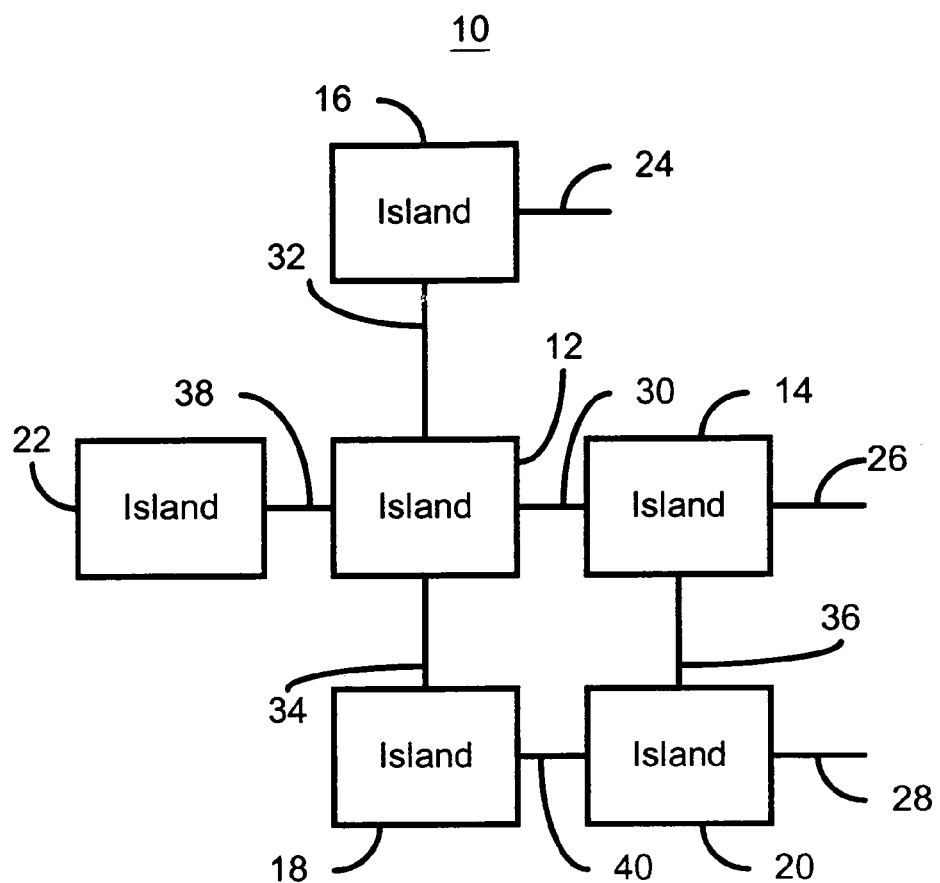
FIG. 1 is a block diagram of an integrated circuit.
Figure 2A:
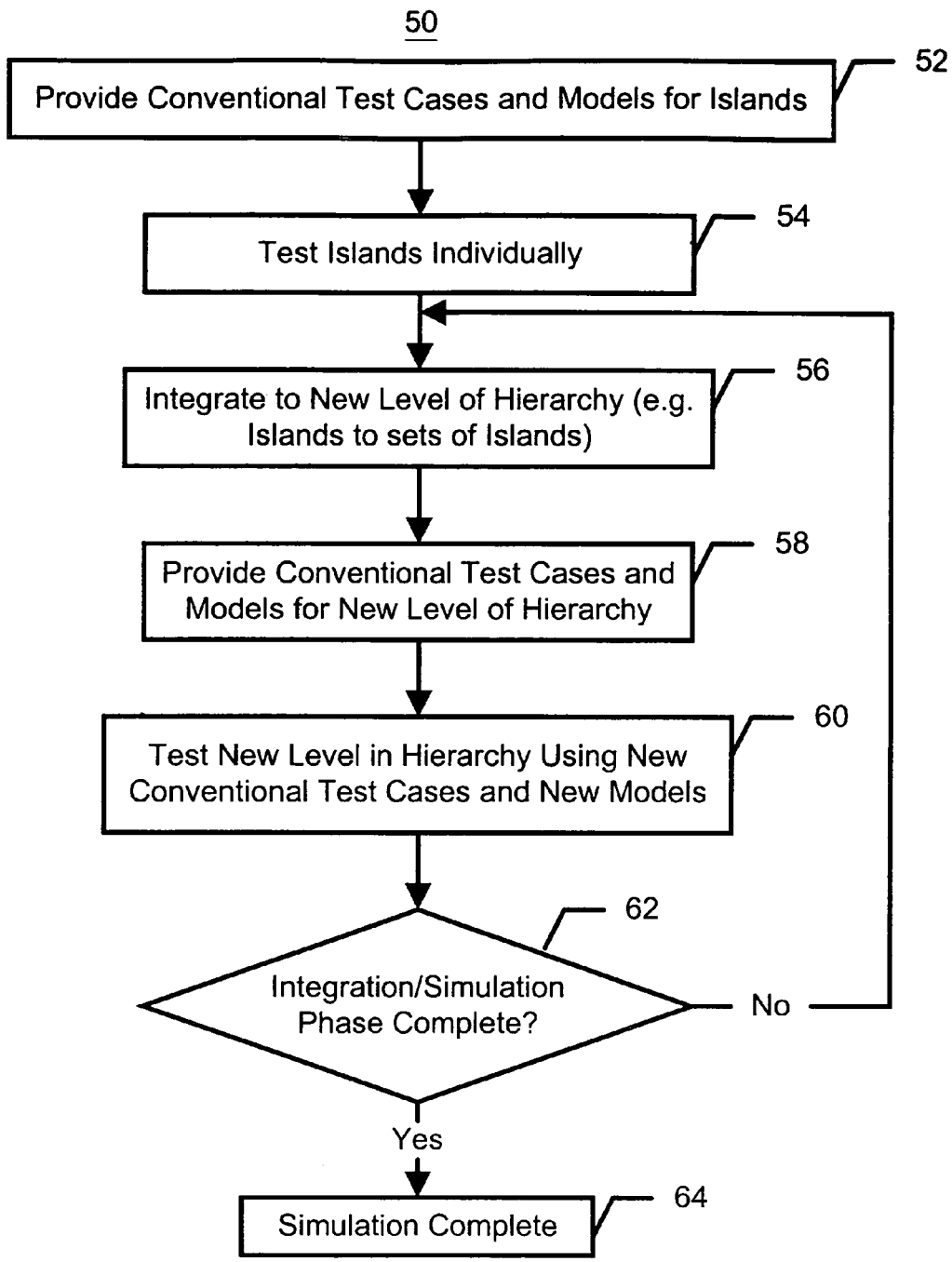
FIG. 2A is a flow chart depicting a conventional method for performing the simulation phase of development using conventional models and test cases.
Figure 2B:
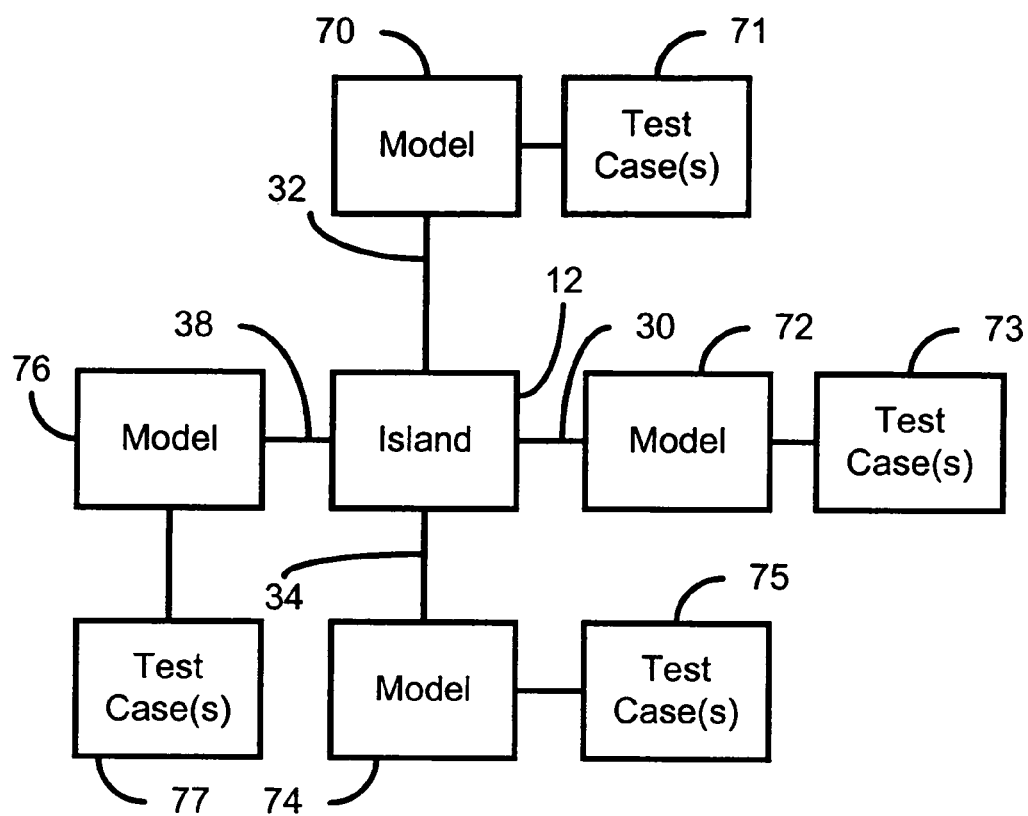
FIG. 2B is a diagram of an island during simulation using conventional models and test cases.
Figure 2C:
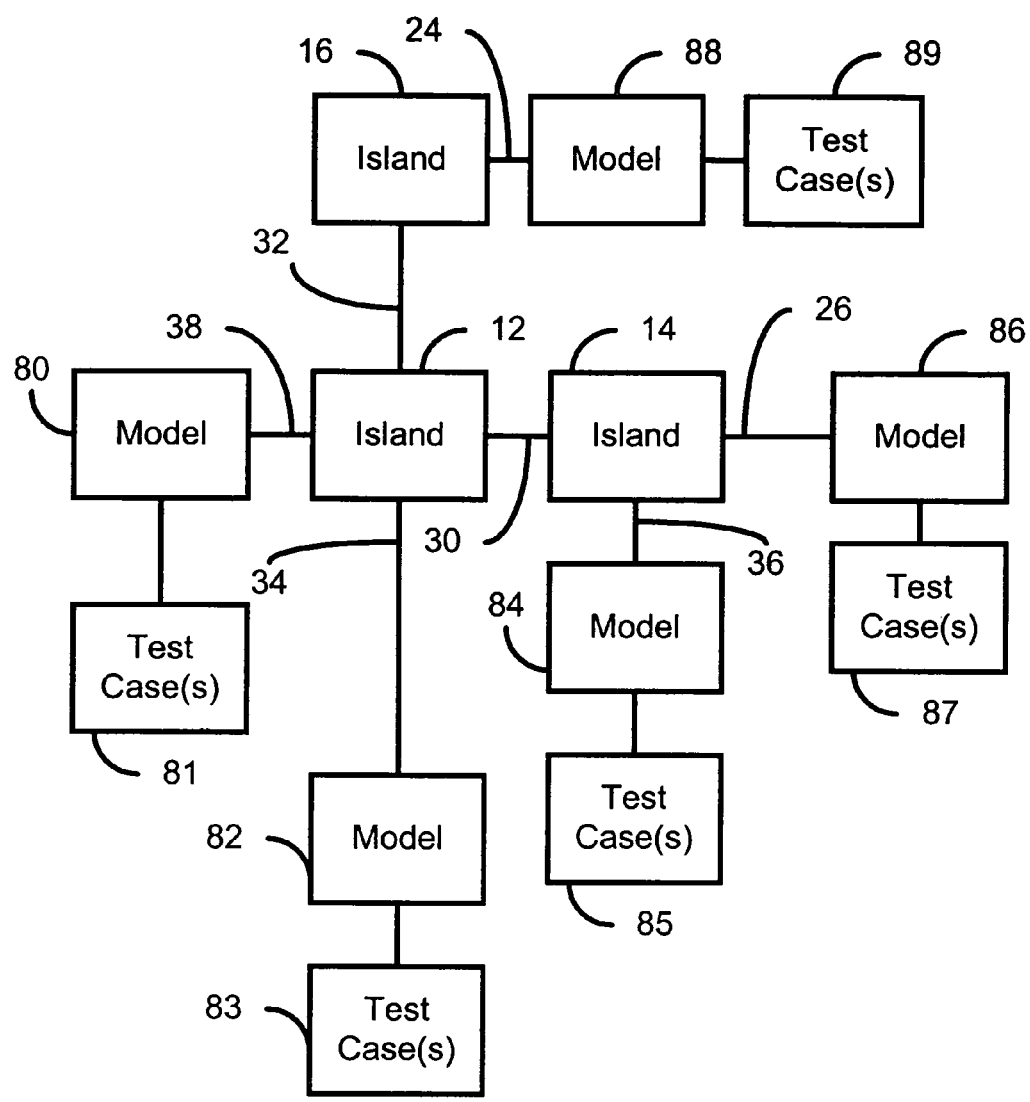
FIG. 2C is a diagram of a set of islands during simulation using conventional models and test cases.
Figure 2D:
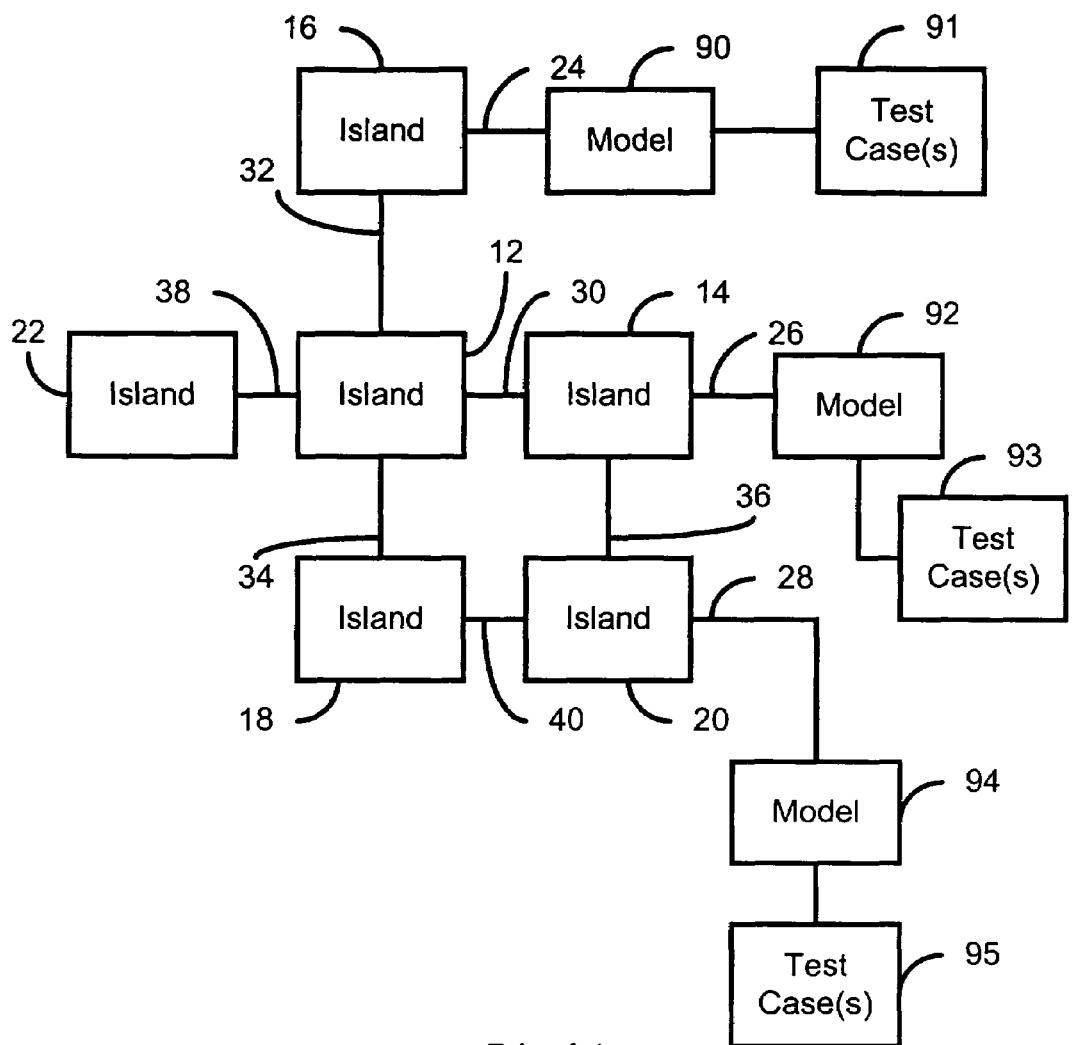
FIG. 2D is a diagram of the integrated circuit during simulation using conventional models and test cases.

The present invention relates to an improvement in integrated circuit ("IC") development. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Currently, most ICs are designed in a hierarchical fashion using a behavioral or model language, such as VHDL or Verilog. Typically, an IC is designed based on functional units, known as islands. Islands may be integrated, or stitched together, to form a higher level in the hierarchy that makes up the IC. Once the code for the IC has been compiled, it is tested in a simulation phase. In order to provide more exhaustive testing, the islands are typically tested first, using conventional test cases and models. Conventional models are pieces of code which are coupled directly to an island. Conventional models provide inputs to and receive outputs from the corresponding islands. Conventional test cases control the conventional models and provide data which are to be input to the islands. Once the islands are tested, sets of islands are integrated together. New conventional test cases and models are then provided for testing the new level in the hierarchy. The new level in the hierarchy is then tested and, when testing is complete, integrated to another level in the hierarchy. This process of providing new test cases, testing islands and integrating islands is repeated until the highest level of the hierarchy, the entire IC, has been tested.

Although conventional simulation using conventional test cases and models is possible, the process is inefficient. New test cases and models are provided for each level in the hierarchy. This can be time consuming and difficult. Furthermore, a large number of test cases, which are relatively complex, must be provided at each level in order to test a larger number of permutations of inputs to the level of the hierarchy being tested. Finally, the conventional method for performing simulation may only test inputs to and outputs from an external interface of the IC. Thus, the ability of conventional test cases and methods to diagnose problems in the IC may be limited, particularly at higher levels of integration.

The present invention provides a method and system for providing simulation of an integrated circuit during development of the integrated circuit. The integrated circuit has an island that includes an interface. The method and system include a snooper, a checker and a generator. The snooper is coupled with an interface and is for obtaining an output provided by the island during simulation and forwarding the information to the checker. The checker is coupled with an interface and is for checking the output(s) to determine whether the output(s) are desired output(s). The generator is coupled with an interface and is for providing an input or inputs to the island during simulation and is usually directed by a test case. The snooper, checker and generator replace the conventional model discussed above.

The present invention will be described in terms of a particular IC having islands with certain interfaces. However, one of ordinary skill in the art will readily recognize that this method and system will operate effectively for other ICs and other islands. Furthermore, the present invention can be used with another number of hierarchies. The present invention is also described in the context of specific connections between the snooper, checker, generator, and islands. However, one of ordinary skill in the art will readily realize that the method and system can couple the snooper, checker, generator and islands in another manner, or combine functions of the snooper and checker.

Figure 3:
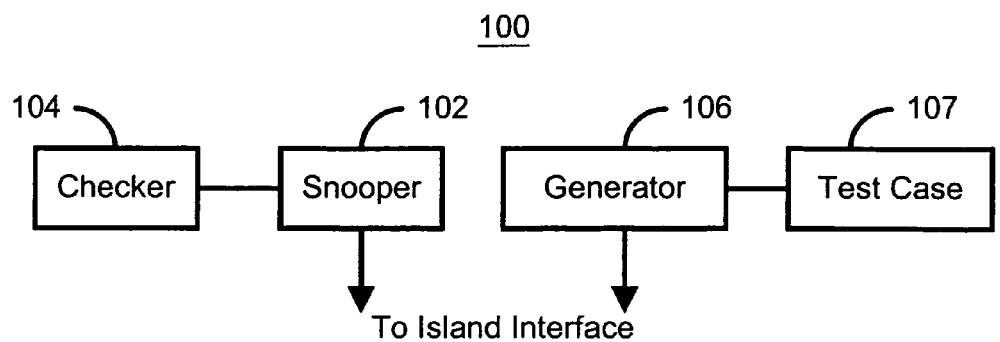
FIG. 3 is a block diagram of a system in accordance with the present invention for use in the simulation phase if integrated circuit development.

To more particularly illustrate the method and system in accordance with the present invention, refer now to FIG. 3, depicting one embodiment of a model, or system, for use in the simulation phase of development of an IC. The system 100 includes a snooper 102, a checker 104, and a generator 106. Also depicted is a test case 107 that usually directs the generator. The test case 107 is preferably composed of routines which provide varying degrees of control to the generator 106. The generator 106 responds to the routines to check the IC 10 in conjunction with the snooper 102 and checker 104. The test case 107 can be provided using a number of languages and still function with the snooper 102, checker 104 and generator 106. Use of a different language for the test case 107, therefore, does not affect the ability of the snooper 102 and checker 104 to perform their functions, discussed below. However, the test case 107 is preferably in the same language as the snooper 102, checker 104 and generator 106. Furthermore, the test case 107 could be replaced with another test case (not shown in FIG. 3) for use with the generator 106.

The snooper 102, checker 104 and generator 106 are preferably made using the same code as the IC with which the snooper 102, checker 104 and generator 106 are used. Thus, the snooper 102, checker 104 and generator 106 are preferably provided using a behavioral language. However, the IC is often represented in a number of ways. For example, during development, the IC may be represented using the behavioral language, register transfer level ("RTL") and gates. The representation of the IC often changes for different phases of the development of the IC. It is generally desirable to provide a simulation environment for these different representations of the IC. In a preferred embodiment, therefore, use of different representations for the islands in the IC does not affect the operation of the snooper 102, checker 104 and generator 106. Consequently, the snooper 102, checker 104 and generator 106 can be used for checking the IC during multiple phases of development.

The snooper 102, the checker 104 and the generator 106 are coupled with an interface of an island during use in the simulation phase. In a preferred embodiment, the checker 104 is coupled with the interface through the snooper 102. However, the checker 104 could be coupled directly to the interface of the island. The snooper 102 monitors the interface and obtains any output the island provides over the interface. The snooper 102 can also monitor inputs to the island at the interface. The snooper 102 provides the appropriate input(s) and output(s) to the checker 104. Consequently, the snooper 102 preferably has sufficient intelligence, for example understanding a bus protocol, to determine which data should be obtained from the interface and provide the appropriate data to the checker 104. The checker 104 checks the output against a desired output to determine whether the output is as expected. The desired output can be determined by the checker 104 based on the inputs to the island, which can also be provided by the snooper 102. Consequently, the checker 104 can adapt to new inputs provided to the island. The generator 106 can provide inputs to the interface. Thus, the generator 106 simulates a device or external input which may be provided to the island through the interface. In a preferred embodiment, the generator 106 can also receive the output from the interface and, based on the output, provide the input back to the interface. The generator 106 also preferably provides randomization of data provided to the island. Using a framework of instructions provided by the test case 107, the generator 106 has sufficient intelligence to not only provide inputs to the island and receive information from the island, but also to randomize the inputs provided to the island. Thus, more exhaustive testing is obtainable while using fewer, simpler test cases. Furthermore, the snooper 102, checker 104 and generator 106 can communicate with other snoopers, checkers and generators (not shown in FIG. 3) that are not directly connected to the snooper 102, checker 104 and generator 106 through the use of shared constructs for exchanging information.

When the island is integrated and a portion of the design is coupled to the interface, the generator 106 is preferably removed, while the snooper 102 and checker 104 preferably remain. The generator 106 is preferably replaced by an actual design when the island is integrated. The snooper and checker 104 remain in order to provide step-wise checking, discussed below, of the integrated islands. However, if the interface is an external interface, the generator 106, snooper 102 and checker 104 preferably remain for continued use in testing the island.

The test case 107 may provide data which the generator 106 inputs to the island via the interface. However, the test case does not require intelligence for controlling the snooper 102, the checker 104, and the generator 106. Instead, the snooper 102, checker 104 and generator 106 contain the requisite intelligence for performing their functions. Thus, the snooper 102, checker 104 and generator 106 use the data from the test case to check and verify the specified behavior of the island at the interface at which the snooper 102, checker 104 and generator 106 are connected. Thus, the snooper 102, checker 104 and generator 106 can replace the conventional model in checking the IC 10. Furthermore, the generator could be replaced by a model provided by a vendor for testing the design. The vendor model can replace the generator when the vendor model operates within the tolerances of the interface with which the vendor model connects.

Figure 7A:
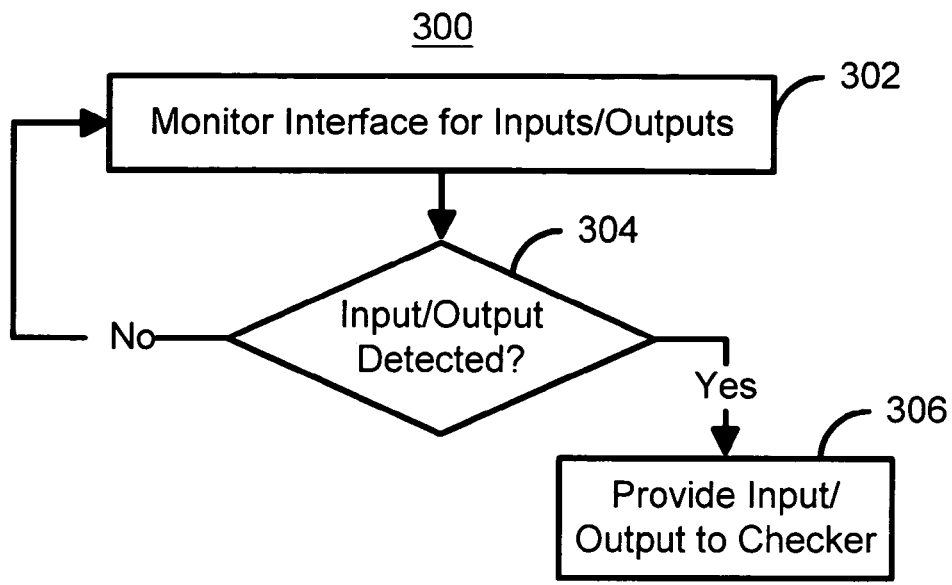
FIG. 7A is a flow chart depicting one embodiment of a method in accordance with the present invention performed by one embodiment of a snooper in accordance with the present invention.

FIG. 7A is a flow chart depicting one embodiment of a method 300 in accordance with the present invention performed by one embodiment of a snooper 102 in accordance with the present invention. For clarity, the method 300 is described in conjunction with the interface 24 of the island 16. Thus, it is assumed that the snooper 102 is coupled with the interface 24 of the island 16. The snooper 102 monitors the interface 24, via step 302. It is determined whether an input and/or output have been detected, via step 304. If an output is not detected, then the interface 24 is continued to be monitored, in step 302. However, if an input and/or output are detected, then the input and/or output may be provided to the checker 104, via step 306.

Figure 7B:
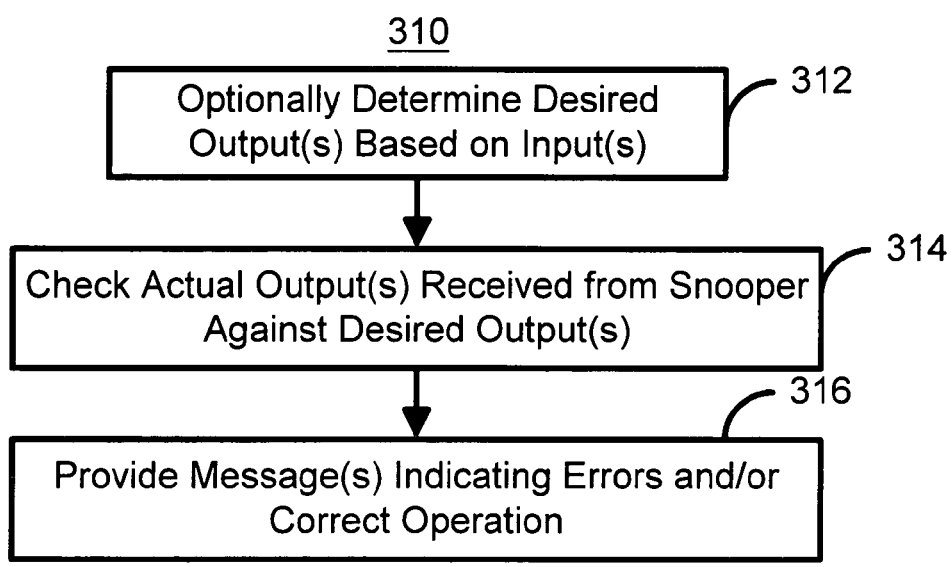
FIG. 7B is a flow chart depicting one embodiment of a method in accordance with the present invention performed by one embodiment of a checker in accordance with the present invention.

FIG. 7B is a flow chart depicting one embodiment of a method 310 in accordance with the present invention performed by one embodiment of a checker 104 in accordance with the present invention. For clarity, the method 310 is described in conjunction with the interface 24 of the island 16. Thus, it is assumed that the checker 104 is coupled with the interface 24 of the island 16, preferably through the snooper 102. The checker 104 can, in some embodiments, generate the desired output(s) based upon the input(s), via step 312. The input(s) used in step 312 are provided by the snooper 102. However, in an alternate embodiment, the checker 104 can be provided with the desired output(s). The checker 104 checks the actual output(s) from the interface 24, and provided by the snooper 102, against the desired output(s), via step 314. Thus, the checker 104 checks the output(s) for errors in step 314. The checker 104 can then output a message indicating whether there are errors in the output, via step 316. Thus, the checker 104 checks the output(s) from the interface 24 that are provided by the snooper 102 to determine whether the island 16 being tested is operating properly.

Figure 7C:
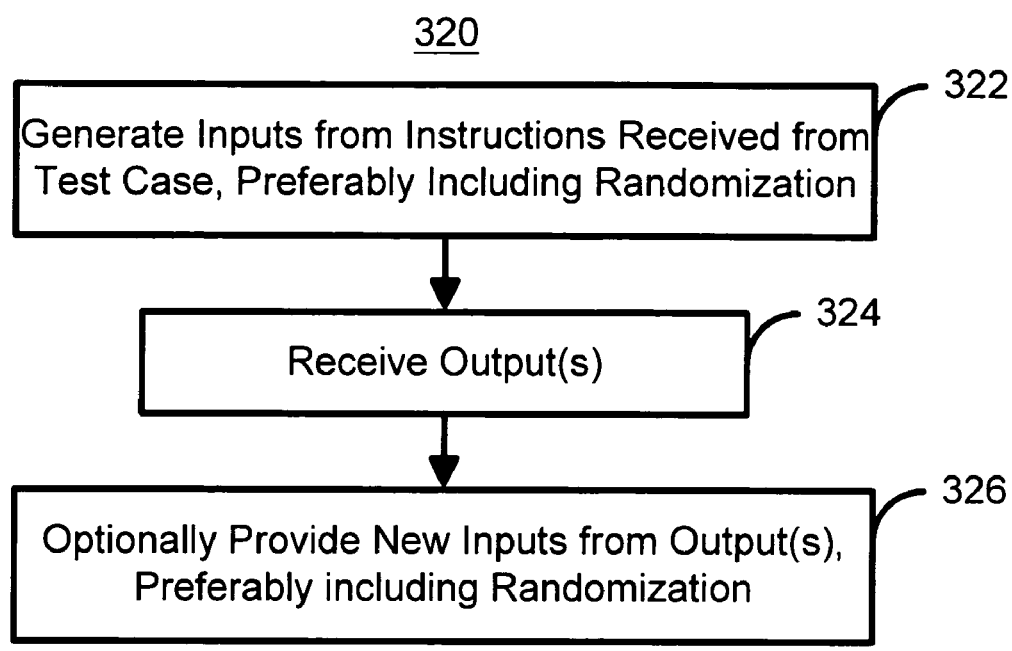
FIG. 7C is a flow chart depicting one embodiment of a method in accordance with the present invention performed by one embodiment of a generator in accordance with the present invention.

FIG. 7C is a flow chart depicting one embodiment of a method 320 in accordance with the present invention performed by one embodiment of a generator 106 in accordance with the present invention. For clarity, the method 320 is described in conjunction with the interface 24 of the island 16. Thus, it is assumed that the generator 106 is coupled with the interface 24 of the island 16. The generator 106 is also coupled with a test case 107. The generator 106 generates input(s) for the interface 24 using instructions from the test case 107, via step 322. In a preferred embodiment, the generator 106 also introduces some randomness to the input(s) in step 322. The generator 106 may also receive output(s) from the interface 24, via step 324. The output(s) received are based upon the inputs that the generator 106 previously provided. The generator 106 may then generate new input(s), preferably using some randomization, for the interface 24, via step 326. The method 320 can thus be repeated until sufficient testing of the island 16 has been performed.

Figure 4A:
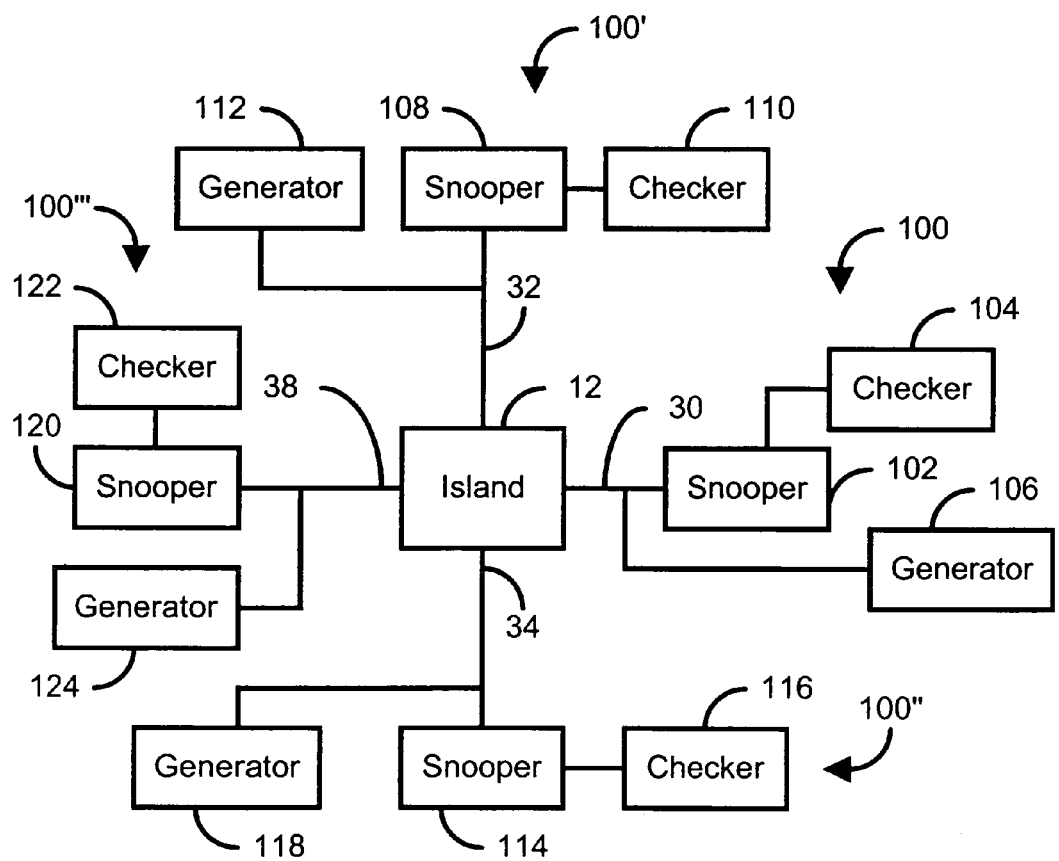
FIG. 4A is a block diagram of systems in accordance with the present invention being used for checking an island in the simulation phase if integrated circuit development.

FIG. 4A depicts several systems 100 as used in the simulation phase of development for the IC 10 depicted in FIG. 1. Referring back to FIG. 4A, one island 12 of the IC 10 is depicted. The island 12 includes interface 30, 32, 34 and 38. Systems 100, 100', 100" and 100''' are coupled with interface 30, 32, 34 and 38, respectively. The systems 100, 100', 100" and 100''' are used in checking the island 12. The system 100', 100" and 100''' are analogous to the system 100. Similar systems can be used in individually checking the remaining islands 14, 16, 18, 20 and 22. Preferably, each interface for each island can be coupled to a snooper, checker and generator combination. System 100 includes snooper 102, checker 104 and generator 106. System 100' includes snooper 108 checker 110 and generator 112. System 100" includes snooper 114, checker 116 and generator 118. System 100''' includes snooper 120, checker 122 and generator 124. Each snooper 102, 108, 114 and 120 snoops the corresponding interface 30, 32, 34 and 38, respectively, in order to obtain signals output by the island 12. Each checker 104, 110, 116 and 122 checks the output from the corresponding interface 30, 32, 34 and 38, respectively, to determine whether the island 12 is providing the correct output. Each generator 106, 112, 118 and 124 provides an input to the corresponding interface 30, 32, 34 and 38, respectively, in order to stimulate the island 12. The system 100 emulates the island 14. The system 100' emulates the island 16'. The system 100" emulates the island 18. The system 100''' emulates the island 22. Furthermore, the systems 100, 100', 100" and 100''' obtain and check the output for the interfaces 30, 32, 34, and 38, respectively.

Figure 4B:
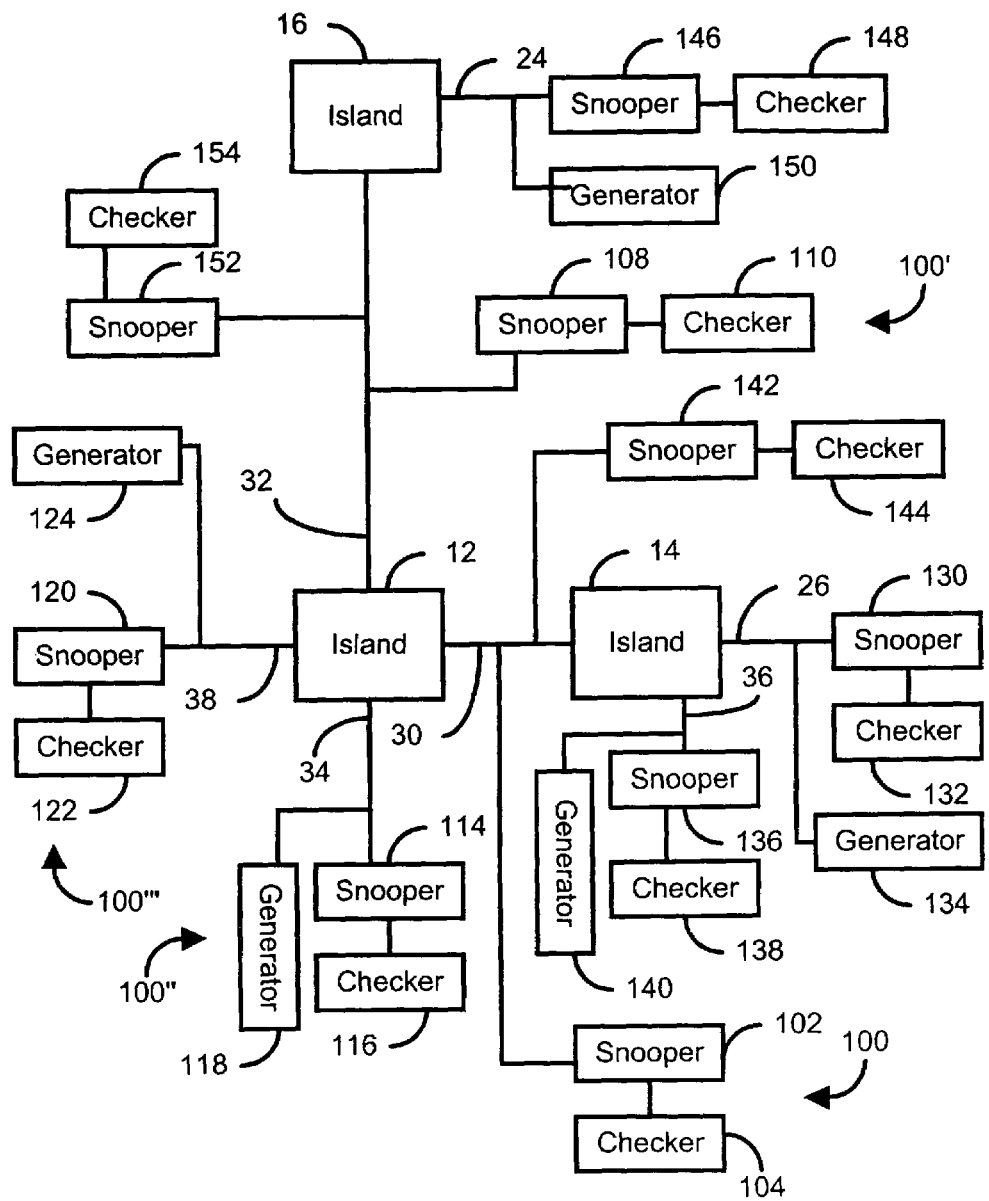
FIG. 4B is a block diagram of systems in accordance with the present invention being used for checking a set of islands in the simulation phase if integrated circuit development.

FIG. 4B depicts the systems 100, 100', 100" and 100''' at the next stage in integration. The island 12 has been stitched together with islands 14 and 16 at interfaces 30 and 32. Thus, portions of the systems 100 and 100' have been replaced by actual design, the islands 14 and 16. In one embodiment, all of the systems 100 and 100' are replaced when the island 12 is integrated with the islands 14 and 16. However, in a preferred embodiment, only the generators 106 and 112 of the systems 100 and 100', shown in FIG. 4A, are replaced by design islands 14 and 16 in FIG. 4B. Thus, the snoopers 102 and 108 and the checkers 104 and 110 remain when the island 12 is coupled to islands 14 and 16 at interfaces 30 and 32. Thus, the snoopers 102 and 108 and the checkers 104 and 110 are reused when the island 12 is integrated into a higher level in the hierarchy of the IC 10. Because no actual design has been attached to the interfaces 34 and 38, the systems 100" and 100''' are reused when the island 12 is stitched to the islands 14 and 16. Thus, the systems 100" and 100''' emulate the islands 18 and 22, respectively. In addition, the snoopers 102, 108, 114 and 120 obtain any outputs from the interfaces 30, 32, 34 and 38, respectively. The checkers 104, 110, 116 and 122 check any outputs from the interfaces 30, 32, 34 and 38, respectively.

The islands 14 and 16 were also checked using snoopers, checkers, and generators prior to being integrated with the island 12. Thus, the island 14 was checked using the snoopers 130, 136 and 142, checkers 132, 138 and 144, and generators 134 and 140. The island 14 was also checked using a generator coupled to the interface 30. However, because the island 14 was coupled with the island 12 at the interface 30, the generator used at the interface 30 has been removed. Thus, the snoopers 130, 136 and 142, checkers 132, 138 and 144 and generators 134 and 140 are reused when the island 14 is stitched together with the island 12. Similarly, the island 16 was checked using the snoopers 146 and 152, checkers 148 and 154, and generator 150. The island 16 was also checked using a generator coupled to the interface 32. However, because the island 14 was coupled with the island 12 at the interface 32, the generator used at the interface 32 has been removed. Thus, the snoopers 146 and 152, checkers 148 and 154 and generator 150 are reused when the island 16 is stitched together with the island 12. Note, however, that the snoopers 108 and 152 or checker 142 and 102 that are coupled to the same interface 32 or 30, respectively, can be combined. Similarly, checkers 110 and 154 or checkers 104 and 144 can be combined when coupled to the same interface 32 or 30, respectively.

Actually, any generator, snooper or checker can share data with any other generator, snooper or checker. No direct connection between generators, snoopers, or checkers is required because the generators, snoopers and checkers share common constructs for exchanging data. Thus, as data move through the IC 10 and between islands 12, 14, and 16 each step can be predicted, monitored and checked via step-wise checking. For example, assume data generated on the external interface 24 create a sequence of events within the island 16. These events then create another sequence of events within the island 12, which drives events within the island 14. The events in the island 14 finally create an output on the external interface 26. As the generator 150 drives inputs to island 16, the snooper 146 and checker 148 can predict the output(s) on internal interface 32. The snooper(s) 108 and 152 and checker(s) 110 and 154 on internal interface 32 can get data from the snooper(s) 102, 142, 114 and 120; checker(s) 104, 144, 116 and 122 and generator(s) 118 and 124 on internal interfaces 30, 34 and 38 to predict the output(s) on interface 30. Finally, the snooper(s) 102 and 142; and checker(s) 104 and 144 on internal interface 30 can get data from the snooper(s) 130 and 136, checker(s) 132 and 138, and generator(s) 134 and 140 on interfaces 26 and 36 to predict the output(s) on external interface 26. This step-wise checking can uncover failures, while allowing for increased randomization of data and isolating of failures to a specific island or internal interface.

Thus, each of the islands 12, 14, 16, 18, 20 and 22 can be checked using snoopers, checkers and generators coupled to the interfaces of the island. The generators, or other components coupled with the interfaces, may be replaced when an island is coupled with other islands. However, some of the components, such as the snooper and checker, can be reused. As a result, the inputs to and outputs from the interfaces of the islands 12, 14, 16, 18, 20 and 22 can be checked using the same components. Furthermore, as discussed above, snoopers and checkers can be combined. For example, the snoopers 108 and 152 and the checkers 110 and 154 coupled to interface 32 may be combined. Even internal interfaces, such as the interface 32, can be checked using snoopers and checkers, such as the snooper 108 and checker 110. Consequently, step-wise checking of inputs to and outputs from each of the islands can be accomplished even when the islands are integrated.

Figure 5:
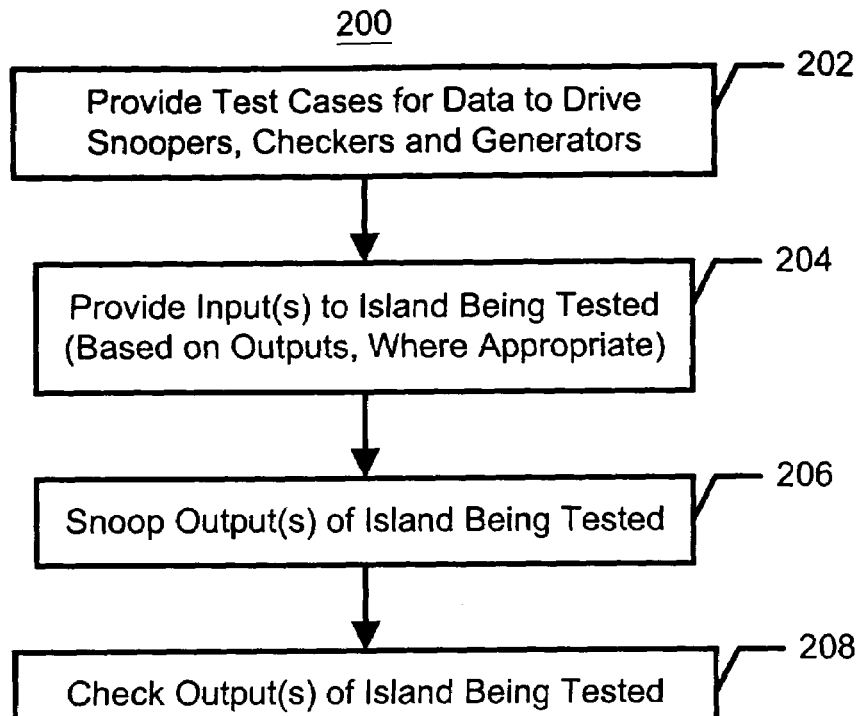
FIG. 5 is one embodiment of a method in accordance with the present invention for testing an island in the simulation phase of integrated circuit development.

FIG. 5 depicts one embodiment of a method 200 in accordance with the present invention for utilizing the system 100 to perform the simulation phase of IC development. The test cases having data for driving the generators, snoopers and checkers are provided, via step 202. The inputs are provided to the island being tested, via step 204. In a preferred embodiment, step 204 is performed by the generator. Step 204 can also be performed later, in response to an output provided by the island. Thus, the generator may provide inputs based on the test cases and based on the outputs of the island being tested. The outputs of the island are snooped, via step 206. In a preferred embodiment, step 206 is performed by a snooper. Thus, the inputs to and outputs of the island under test can be obtained. The outputs of the island are checked against expected outputs, via step 206. Step 206 is preferably performed by a checker which receives the outputs from the corresponding snooper, inputs from the corresponding generator, as well as inputs from other snoopers, checkers and other parts of the system. Thus, inputs are provided to the island, which performs its function and provides outputs. These outputs are then obtained and checked against expected outputs. The outputs can be obtained from internal interfaces, which are or will be coupled with other islands.

Figure 6:
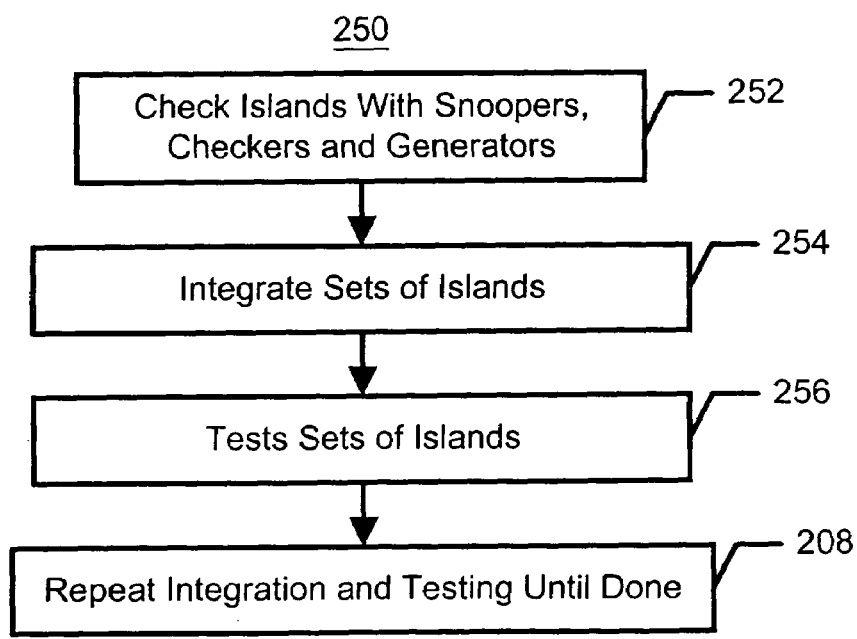
FIG. 6 is one embodiment of a method in accordance with the present invention for performing the simulation phase of integrated circuit development.

FIG. 6 depicts one embodiment of a method 250 for using the method 200 and the system 100 for performing simulation for an IC. Individual islands are checked, using the method 200, via step 252. Thus, snoopers, generators and checkers are preferably used in step 252. The configuration for the island 12 during step 252 is shown in FIG. 4A. Referring back to FIG. 6, the islands are then integrated into sets of islands, via step 254. Thus, some or all of the islands are stitched together in step 254. Furthermore, portions of the systems, such as the system 100, can be replaced in step 254. For example, in a preferred embodiment, the generators that are connected to interfaces which are coupled with other islands are eliminated. However, the snoopers and checkers at these interfaces remain, allowing the inputs to and outputs from these internal interfaces to be checked. Snoopers, generators, and checkers remain at interfaces which are not coupled with other islands. The sets of islands are then checked, via step 256. In order to perform step 256, the snoopers, checkers, and some generators are reused. Test cases may or may not be reused in step 256. The test cases are generally not reused if the test cases provided data for internal interfaces. However, if the test cases were provided for external interfaces, such as the interface 26 depicted in FIG. 4B, the test cases may be reused. The integration and testing steps are then repeated until simulation for the IC is completed, via step 258.

Because the snoopers, checkers, and generators may be reused, resources are saved using the system 100 and methods 200 and 250. Thus, snoopers, checkers and generators need only be developed once. This is in contrast to the conventional models, which must be separately provided for each level in the hierarchy of the IC. In addition, the snoopers, checkers and generators include the intelligence to provide their functions. The test cases provide to the generator some instructions and/or data for checking the IC. The test cases thus provide a relatively high level outline which the generator uses for checking the island. The test cases are, therefore, relatively simple to develop and maintain. This is in contrast to a conventional test case, which includes sufficient intelligence for controlling the models and is relatively difficult to construct. The test cases are simpler to build than conventional test cases. Although the snoopers, checkers and generators may be more complex than conventional models, only a few snoopers, checkers and generators are required. Significantly more test cases are generally used. However, the test cases are relatively simple and easy to build. Thus, resource required for the simulation are reduced because the complex snoopers, checkers and generators are few in number can be reused and because the more numerous test cases that may be newly developed at each level in the hierarchy of the IC are much simpler than conventional test cases.

Furthermore, testing can be improved. The snoopers and checkers can be coupled with internal interfaces. For example, as shown in FIG. 4B, the snooper 102 and the checker 104 are coupled to the internal interface 30. As a result, the outputs islands provide over internal interfaces can be checked. Step-wise checking, or checking of the functions provided by a group of islands as the functions are performed, can thus be accomplished. This is in contrast to conventional test cases and models, which only check the output of an island on an external interface. Because step-wise checking is provided, the location of a failure can be more easily and rapidly determined. In addition, relatively exhaustive testing of individual islands can still be provided using test cases and snoopers, checkers and generators for each island. This allows for a comprehensive system integrated test. In some cases, individual islands function independently. However, when the islands are stitched together, there may be failures which prevent the islands from adequately functioning together. Step-wise checking using a combination of snoopers, checkers and, where appropriate, generators checks both external and internal interfaces. The existence and locations of failures preventing the islands from adequately functioning together can, therefore, be uncovered. The failures can then be fixed, allowing the islands to operate as a unit. Consequently, development of the IC 10 is facilitated.

Furthermore, the savings in resources achieved using a method and system in accordance with the present invention are increased with ICs which are systems on a chip. In such ICs, core technologies are used. In other words, different cores, such as a processor core or an ethernet/media access controller core, are developed. Each core corresponds to a group of islands and specified functions. Customized ICs are provided by integrating, or stitching together, different cores. Using the method and system in accordance with the present invention, the simulation phase can be provided for different cores. The snoopers, checkers and some generators are provided for islands in the core and used in performing the simulation phase, checking and integration, for the core. Appropriate snoopers, checkers and generators are also retained for each core. When the cores are stitched together, the snoopers, checkers and generators that are already present can be used to check the stitched together cores. This is true regardless of the cores which are being stitched together. Consequently, not only can snoopers, checkers, and generators be reused in performing the simulation phase for individual cores, but the snoopers, checkers and generators can be reused when stitching together cores. Thus, the simulation phase for customized ICs is relatively simple once the simulation phase for the individual cores is completed. Consequently, resources can be further saved when core technology is reused.

A method and system for performing the simulation phase of IC development has been disclosed. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for providing simulation of an integrated circuit during development of the integrated circuit, the integrated circuit having an island including an interface, the system comprising:

a snooper coupled with the interface for monitoring the interface and obtaining an output provided by the island during simulation;

a checker, coupled with the interface, for checking the output to determine whether the output is a desired output;

a generator coupled with the island for providing an input to the island during simulation; and at least one test case coupled with the generator and for providing data and a request that the generator perform a particular simulation on the island without the test case including logic for directly controlling functions of the snooper, the generator and the checker;

wherein the checker further calculates the desired output based upon the input; and wherein the generator further includes intelligence to provide the input to the island based only upon the data and the request.

2. The system of claim 1 wherein the checker is coupled with the snooper and wherein the checker receives the output from the snooper.

3. The system of claim 1 wherein the snooper may be reused when the island is integrated with a second island.

4. The system of claim 1 wherein the checker may be reused when the island is integrated with a second island.

5. The system of claim 1 wherein the generator may be reused when the island is integrated with a second island.

6. The system of claim 1 wherein the generator receives the output and provides the input based on the output.

7. The system of claim 1 wherein the generator and the snooper are coupled with the interface, wherein the checker is coupled with the interface through the snooper and wherein only the snooper and the checker are reused when a second island is integrated with the island at the interface.

8. The system of claim 1 wherein the at least one test case further provides data and instructions to the generator.

9. The system of claim 1 wherein the interface is an internal interface.

10. A method for providing simulation of an integrated circuit during development of the integrated circuit, the integrated circuit having an island including an interface, the method comprising the steps of:

monitoring the interface to obtain an output provided by the island during simulation utilizing a snooper;

checking the output to determine whether the output is a desired output utilizing a checker, the checking step further including the step of calculating the desired output based upon an input;

providing the input to the island during simulation using a generator; and directing the providing of the input using at least one test case by providing data and a request that a generator perform a particular simulation on the island without the test case including logic for directly controlling functions of the generator, the snooper, and the checker;

wherein the input is provided to the island using the generator including intelligence to provide the input to the island based only upon the data and the request.

11. The method of claim 10 wherein the monitoring step further includes the step of:

snooping the interface to obtain the output provided by the island during simulation using the snooper, the snooper capable of being reused when the island is integrated with a second island.

12. The method of claim 10 wherein the checking step further includes the step of:

checking the output using the checker to determine whether the output is the desired output, the checker capable of being reused when the island is integrated with a second island.

13. The method of claim 10 wherein the providing step further includes the step of:

providing the input to the island during simulation using the generator, the generator capable of being reused when the island is integrated with a second island.

14. The method of claim 10 wherein the providing step further includes the step of:

providing an input to the island during simulation using the generator, the generator receiving the output and providing the input based on the output.

15. The method of claim 14 wherein the directing step further includes the step of:

providing the data and instructions from the at least one test case to the generator.

16. The method of claim 10 wherein the interface is an internal interface.

17. A computer-readable medium having a program for providing simulation of an integrated circuit during development of the integrated circuit, the integrated circuit having an island including an interface, the program comprising instructions for:

monitoring the interface to obtain an output provided by the island during simulation using a snooper;

checking the output to determine whether the output is a desired output using a checker, the checking step further including the step of calculating the desired output based upon an input;

providing the input to the island during simulation using a generator; and directing the providing of the input using at least one test case by providing data and a request that the generator perform a particular simulation on the island without the test case including logic for directly controlling functions of the generator, the snooper, and the checker;

wherein the input is provided to the island using the generator including intelligence to provide the input to the island based only upon the data and the request.

18. The computer-readable medium of claim 17 wherein the instruction for monitoring further includes the instructions for:

snooping the interface to obtain the output provided by the island during simulation using the snooper, the snooper capable of being reused when the island is integrated with a second island.

19. The computer-readable medium of claim 17 wherein the instruction for checking further includes instructions for:

checking the output using the checker to determine whether the output is the desired output, the checker capable of being reused when the island is integrated with a second island.

20. The computer-readable medium of claim 17 wherein the input providing instructions further includes instructions for:

providing the input to the island during simulation using the generator, the generator capable of being reused when the island is integrated with a second island.

21. The computer-readable medium of claim 17 wherein the input providing instructions further includes instructions for:

providing an input to the island during simulation using the generator, the generator receiving the output and providing the input based on the output.

22. The computer-readable medium of claim 17 wherein the directing instructions further includes the instructions for:

providing data and instructions from the at least one test case to the generator.

23. The computer-readable medium of claim 17 wherein the interface is an internal interface.

* * * * *